United States Patent
Sekiya

(10) Patent No.: US 10,847,398 B2
(45) Date of Patent: Nov. 24, 2020

(54) CHUCK TABLE CORRECTION METHOD AND CUTTING APPARATUS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/216,351

(22) Filed: Dec. 11, 2018

(65) Prior Publication Data

US 2019/0198379 A1 Jun. 27, 2019

(30) Foreign Application Priority Data

Dec. 27, 2017 (JP) .................................. 2017-252137

(51) Int. Cl.
*H01L 21/68* (2006.01)
*H01L 21/687* (2006.01)
*H01L 21/67* (2006.01)
*B28D 5/00* (2006.01)

(52) U.S. Cl.
CPC ............ *H01L 21/68* (2013.01); *B28D 5/0082* (2013.01); *H01L 21/67092* (2013.01); *H01L 21/68728* (2013.01); *H01L 21/68764* (2013.01)

(58) Field of Classification Search
CPC ...................................................... H01L 21/68
See application file for complete search history.

(56) References Cited

U.S. PATENT DOCUMENTS

| 5,287,619 A * | 2/1994 | Smith ................. H01L 21/4857 204/192.17 |
| 7,271,888 B2 * | 9/2007 | Frodis ................. B81C 1/00492 356/237.1 |
| 2001/0033369 A1 * | 10/2001 | Matsui .................... G03F 7/707 355/53 |
| 2002/0072251 A1 * | 6/2002 | Itou ......................... G03F 7/162 438/782 |
| 2010/0112782 A1 * | 5/2010 | Teixeira ................ H01L 21/304 438/458 |
| 2016/0297091 A1 * | 10/2016 | Komatsu ................. H01L 22/20 |

FOREIGN PATENT DOCUMENTS

| JP | 2015018965 A | 1/2015 |
| JP | 2015170805 A * | 9/2015 |
| JP | 2017084932 A | 5/2017 |

OTHER PUBLICATIONS

English Translation JP2015170805. (Year: 2015).*

* cited by examiner

Primary Examiner — Jennifer B Swinney
(74) Attorney, Agent, or Firm — Greer Burns & Crain, Ltd.

(57) ABSTRACT

A chuck table correction method includes the step of: positioning a lower end of a cutting blade, relative to a chuck table, at a predetermined height for cutting into a holding surface; and relatively moving the chuck table and a cutting unit in a processing feeding direction, to cut the holding surface side of the chuck table, thereby forming the chuck table with a corrected surface that functions as a new holding surface.

6 Claims, 3 Drawing Sheets

CHUCK TABLE CORRECTION METHOD AND CUTTING APPARATUS

BACKGROUND OF THE INVENTION

Field of the Invention

The present invention relates to a chuck table correction method for correcting a chuck table of a cutting apparatus and a cutting apparatus in which the chuck table correction method is adopted.

Description of the Related Art

At the time of cutting a plate-shaped workpiece represented by a semiconductor wafer or a package substrate, there is used, for example, a cutting apparatus which includes a chuck table having a holding surface for holding the workpiece, and a cutting unit provided with an annular cutting blade. The workpiece is held by the holding surface of the chuck table, and, while causing the cutting blade in rotation to cut into the workpiece, the chuck table and the cutting unit are relatively moved, whereby the workpiece can be cut.

In the cutting apparatus as aforementioned, the cutting-in depth of the cutting blade into the workpiece is controlled based on a position (height) of the holding surface of the chuck table and a position (height) of a lower end (tip) of the cutting blade. Therefore, if the position of the holding surface of the chuck table and the position of the lower end of the cutting blade can be managed suitably, it is possible, for example, to remove from the wafer a thin functional layer provided on a front surface of the wafer, or to remove the wafer from the functional layer (see, for example, Japanese Patent Laid-Open No. 2015-18965 and Japanese Patent Laid-Open No. 2017-84932).

SUMMARY OF THE INVENTION

Meanwhile, in order that the cutting-in of the cutting blade into the workpiece is realized with a high accuracy as aforementioned, the holding surface of the chuck table should be in the state of being extremely close to be parallel to the direction of relative movement of the chuck table and the cutting unit. On the other hand, an upper surface of a chuck table base for supporting the chuck table may be inclined, or the thickness of the chuck table may not be uniform.

In addition, depending on the accuracy of a moving mechanism for relatively moving the chuck table and the cutting unit, the chuck table may be inclined relative to the moving direction during the relative movement. In such a case, the holding surface of the chuck table is also inclined relative to the direction of relative movement. For this reason, it has been impossible to sufficiently enhance the accuracy of cutting-in of the cutting blade relative to the workpiece.

It is therefore an object of the present invention to provide a chuck table correction method by which the accuracy of cutting-in of a cutting blade relative to a workpiece can be sufficiently enhanced, and a cutting apparatus in which the chuck table correction method is adopted.

In accordance with an aspect of the present invention, there is provided a chuck table correction method for correcting a chuck table provided in a cutting apparatus. The cutting apparatus includes the chuck table adapted to hold a workpiece by a holding surface; a cutting unit adapted to cut the workpiece held by the chuck table by a cutting blade mounted to a spindle; a processing feeding unit adapted to relatively move the chuck table and the cutting unit in a processing feeding direction perpendicular to an axis of the spindle; an indexing feeding unit adapted to relatively move the chuck table and the cutting unit in an indexing feeding direction parallel to the axis; and a cutting-in feeding unit adapted to relatively move the chuck table and the cutting unit in a cutting-in feeding direction perpendicular to the processing feeding direction and the indexing feeding direction. A lower end of the cutting blade is positioned, relative to the chuck table, at a predetermined height for cutting into the holding surface, and the chuck table and the cutting unit are relatively moved in the processing feeding direction, to cut the holding surface side of the chuck table by the cutting blade, thereby forming the chuck table with a corrected surface that functions as a new one of the holding surface.

In the described aspect of the present invention, preferably, the chuck table correction method includes: a processing feeding step of relatively moving the chuck table and the cutting unit in the processing feeding direction in a state in which the lower end of the cutting blade is positioned at the predetermined height; and an indexing feeding step of relatively moving the chuck table and the cutting unit in the indexing feeding direction by a distance smaller than a thickness of the cutting blade. The processing feeding step and the indexing feeding step are repeated to thereby form the corrected surface wholly on the holding surface side.

In accordance with another aspect of the present invention, there is provided a cutting apparatus including: a chuck table adapted to hold a workpiece by a holding surface; a cutting unit adapted to cut the workpiece held by the chuck table by a cutting blade mounted to a spindle; a processing feeding unit adapted to relatively move the chuck table and the cutting unit in a processing feeding direction perpendicular to an axis of the spindle; an indexing feeding unit adapted to relatively move the chuck table and the cutting unit in an indexing feeding direction parallel to the axis; a cutting-in feeding unit adapted to relatively move the chuck table and the cutting unit in a cutting-in feeding direction perpendicular to the processing feeding direction and the indexing feeding direction; and a control unit adapted to control each component of the cutting apparatus. The chuck table includes a suction region having a suction hole for sucking the workpiece, and a peripheral region formed from a conductive non-metallic material and surrounding the suction region, and the control unit causes a lower end of the cutting blade to be positioned, relative to the chuck table, at a predetermined height for cutting into the holding surface, and causes the chuck table and the cutting unit to be relatively moved in the processing feeding direction, to cause the cutting blade to cut into the holding surface side of the chuck table, thereby forming the chuck table with a corrected surface that functions as a new one of the holding surface.

In the described another aspect of the present invention, preferably, the control unit includes: a processing feeding control section adapted to cause the chuck table and the cutting unit to be relatively moved in the processing feeding direction in a state in which the lower end of the cutting blade is positioned at the predetermined height; and an indexing feeding control section adapted to cause the chuck table and the cutting unit to be relatively moved in the indexing feeding direction by a distance smaller than a thickness of the cutting blade. The relative movement in the processing feeding direction caused by the processing feeding control section and the relative movement in the indexing feeding direction caused by the indexing feeding control section are repeated, to form the correction surface wholly on the holding surface side.

In the chuck table correction method according to the described aspect of the present invention, the lower end of the cutting blade is position, relative to the chuck table, at the predetermined height for cutting into the holding surface of the chuck table, and the chuck table and the cutting unit are relatively moved in the processing feeding direction, to thereby cut the holding surface side of the chuck table by the cutting blade.

For this reason, a corrected surface along the direction of relative movement of the chuck table and the cutting unit is formed on the holding surface side of the chuck table. By using the corrected surface as a new holding surface, therefore, it is possible to sufficiently enhance the accuracy of cutting-in of the cutting blade relative to the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
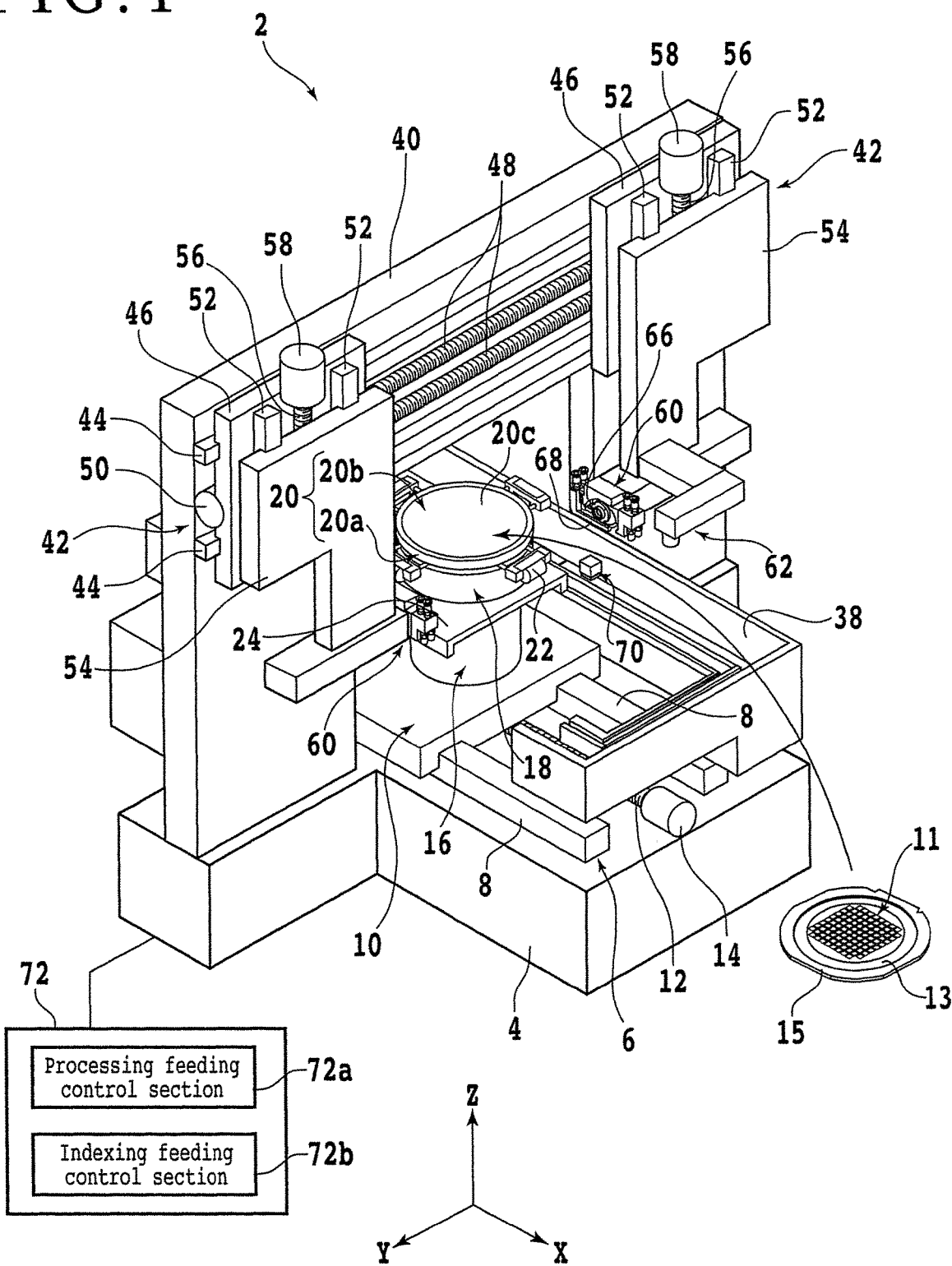
FIG. 1 is a perspective view schematically depicting a configuration example of a cutting apparatus.

An embodiment according to an aspect of the present invention will be described below referring to the attached drawings. FIG. 1 is a perspective view schematically depicting a configuration example of a cutting apparatus 2 to which a chuck table correction method according to the present embodiment is applied. Note that the terms of an X-axis direction, a Y-axis direction and a Z-axis direction used in the following description are perpendicular to one another.

As illustrated in FIG. 1, the cutting apparatus 2 has a base 4 on which to mount each component of the cutting apparatus 2. An X-axis moving mechanism (processing feeding unit) 6 is provided on an upper surface of the base 4. The X-axis moving mechanism 6 includes a pair of X-axis guide rails 8 substantially parallel to an X-axis direction (processing feeding direction, or front-rear direction), and an X-axis moving table 10 is slidably mounted to the X-axis guide rails 8.

A nut section 10a (see FIG. 2A) is provided on a lower surface (back surface) side of the X-axis moving table 10, and the nut section 10a is in screw engagement with an X-axis ball screw 12 parallel to the X-axis guide rails 8. An X-axis pulse motor 14 is connected to one end of the X-axis ball screw 12.

With the X-axis ball screw 12 rotated by the X-axis pulse motor 14, the X-axis moving table 10 is moved in the X-axis direction along the X-axis guide rails 8. The X-axis moving mechanism 6 is provided with an X-axis measurement unit (not depicted) for measuring the X-axis directional position of the X-axis moving table 10.

A chuck table base 18 is provided on an upper surface side (front surface side) of the X-axis moving table 10 through a θ table 16. A chuck table 20 for holding a workpiece 11 is disposed on an upper surface of the chuck table base 18. Four clamps 22 for fixing an annular frame 15, which supports the workpiece 11, from four sides is provided in the periphery of the chuck table 20. Note that the upper side of the X-axis moving mechanism 6 including the X-axis moving table 10 is covered with a table cover 24 and a bellows-formed cover 26 (see FIG. 2A).

The workpiece 11 is, for example, a circular disk-shaped wafer formed of a semiconductor such as silicon, and its upper surface (front surface) side is divided into a central device region and a peripheral surplus region surrounding the device region. The device region is partitioned into a plurality of regions by division lines (streets) arranged in a grid pattern, and a device such as an integrated circuit (IC) and a large scale integration (LSI) is formed in each of the regions.

A dicing tape 13 larger in diameter than the workpiece 11 is adhered to the lower surface (back surface) side of the workpiece 11. A peripheral portion of the dicing tape 13 is fixed to the annular frame 15. In other words, the workpiece 11 is supported by the frame 15 through the dicing tape 13.

Note that while the workpiece 11 is the circular disk-shaped wafer formed of a semiconductor such as silicon in the present embodiment, there are no limitations as to the material, shape, structure, size or the like of the workpiece 11. For example, substrates of arbitrary shapes which are formed of such a material as a ceramic, a resin, or a metal can also be used as the workpiece 11. In addition, there are no limitations as to the kind, number, shape, structure, size, layout or the like of the device or devices. The workpiece 11 may not be formed with devices.

The θ table 16 includes a rotational drive source (not depicted) such as a motor, and rotates the chuck table base 18 and the chuck table 20, both disposed on the upper side, around a rotational axis which is substantially parallel to a Z-axis direction (cutting-in feeding direction, or vertical direction). In addition, when the X-axis moving table 10 is moved in the X-axis direction by the aforementioned X-axis moving mechanism 6, the chuck table 20 is put into processing feeding.

The chuck table 20 includes a frame body (peripheral region) 20a having a recess on the upper surface side, and a holding plate (central region, or suction region) 20b disposed in the recess of the frame body 20a. Upper surfaces of the frame body 20a and the holding plate 20b constitute a holding surface 20c for holding the workpiece 11.

The frame body 20a is configured by use of a conductive non-metallic material, for example. Therefore, by detecting conduction attendant on the contact between the frame body 20a and a cutting blade, the position (height) of the cutting blade relative to the chuck table 20 can be confirmed. As the conductive non-metallic material, there can be used, for example, a ceramic with carbon mixed therein. It is to be noted, however, that the material and the like of the frame body 20a are not particularly limited.

On the other hand, the holding plate 20b is configured by use of a porous ceramic, for example, and is provided with a plurality of suction holes. The holding plate 20b is connected to a suction source 32 such as an ejector through a first flow path 28 (see FIG. 2A) and a first valve 30 (see FIG. 2A). When the workpiece 11 (dicing tape 13) is placed on the holding surface 20c and a negative pressure of the suction source 32 is made to act on the suction holes of the holding plate 20b, the workpiece 11 is suction held by the chuck table 20. It is to be noted, however, that the material and the like of the holding plate 20b are not particularly limited.

Figure 2A:
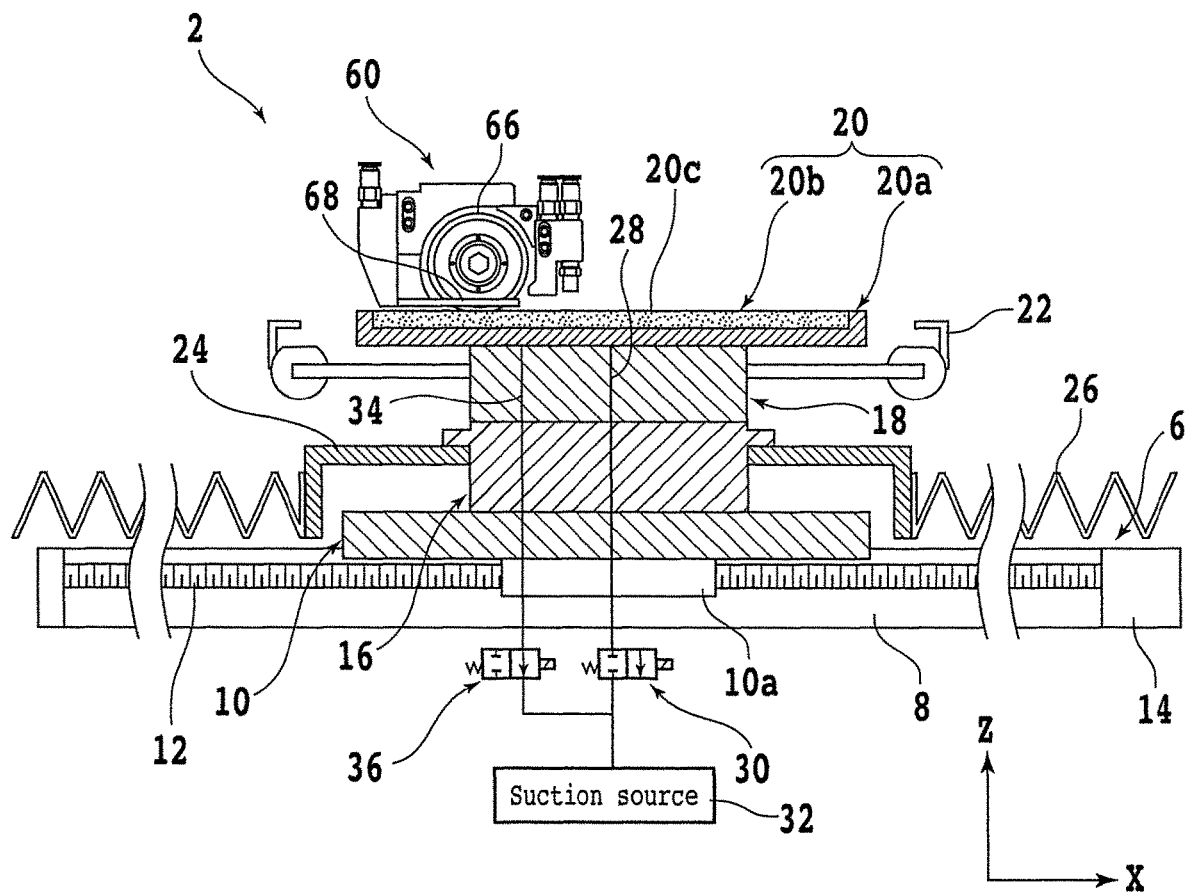
FIG. 2A is a schematic diagram depicting a processing feeding step.

The negative pressure of the suction source 32 is supplied also to an upper surface of the chuck table base 18 through a second flow path 34 (see FIG. 2A) and a second valve 36 (see FIG. 2A). When the chuck table 20 is placed on the upper surface of the chuck table base 18 and the negative pressure of the suction source 32 is made to act on the upper surface of the chuck table base 18, the chuck table 20 is fixed to the chuck table base 18.

At a position proximate to the chuck table 20, a carrying mechanism (not depicted) for carrying the workpiece 11 to the chuck table 20 is provided. In addition, in the vicinity of the X-axis moving table 10, there is provided a water case 38 for temporarily reserving, for example, a waste liquid such as a cutting liquid (e.g., pure water) used at the time of cutting. The waste liquid reserved in the water case 38 is discharged to the exterior of the cutting apparatus 2 through a drain (not depicted) or the like.

A gate-formed support structure 40 straddling the X-axis moving mechanism 6 is disposed on the upper surface of the base 4. Two sets of cutting unit moving mechanisms (an indexing feeding unit, and a cutting-in feeding unit) 42 are provided at upper portions of a front surface of the support structure 40. Each cutting unit moving mechanism 42 commonly includes a pair of Y-axis guide rails 44 which are disposed on the front surface of the support structure 40 and are substantially parallel to the Y-axis direction (indexing feeding direction, or left-right direction). Y-axis moving plates 46 constituting the respective cutting unit moving mechanisms 42 are slidably mounted to the Y-axis guide rails 44.

A nut section (not depicted) is provided on a back surface side of each Y-axis moving plate 46, and the nut section is respectively in screw engagement with a Y-axis ball screw 48 which is substantially parallel to the Y-axis guide rails 44. A Y-axis pulse motor 50 is connected to one end portion of each Y-axis ball screw 48. When the Y-axis ball screw 48 is rotated by the Y-axis pulse motor 50, the Y-axis moving plate 46 is moved in the Y-axis direction along the Y-axis guide rails 44.

On a front surface of each Y-axis moving plate 46 are provided a pair of Z-axis guide rails 52 which are substantially parallel to the Z-axis direction. A Z-axis moving plate 54 is slidably mounted to the Z-axis guide rails 52.

A nut section (not depicted) is provided on a back surface side of each Z-axis moving plate 54, and the nut section is respectively in screw engagement with a Z-axis ball screw 56 which is parallel to the Z-axis guide rails 52. A Z-axis pulse motor 58 is connected to one end portion of each Z-axis ball screw 56. When the Z-axis ball screw 56 is rotated by the Z-axis pulse motor 58, the Z-axis moving plate 54 is moved in the Z-axis direction along the Z-axis guide rails 52.

Each cutting unit moving mechanism 42 is provided with a Y-axis measurement unit (not depicted) for measuring the Y-axis directional position of the Y-axis moving plate 46. In addition, each cutting unit moving mechanism 42 is provided with a Z-axis measurement unit (not depicted) for measuring the Z-axis directional position of the Z-axis moving plate 54.

A cutting unit 60 for cutting the workpiece 11 is fixed to a lower portion of each Z-axis moving plate 54. In addition, at a position adjacent to the cutting unit 60, a camera (imaging unit) 62 for imaging the workpiece 11 is provided. When the Y-axis moving plate 46 is moved in the Y-axis direction by each cutting unit moving mechanism 42, the cutting unit 60 and the camera 62 are put into indexing feeding, and, when the Z-axis moving plate 54 is moved in the Z-axis direction, the cutting unit 60 and the camera 62 are put into cutting-in feeding.

Note that the X-axis directional positions of the cutting unit 60 and the camera 62 relative to the chuck table 20 or the like are measured by the aforementioned X-axis measurement unit. Besides, the Y-axis directional positions of the cutting unit 60 and the camera 62 relative to the chuck table 20 or the like are measured by the aforementioned Y-axis measurement unit. Further, the Z-axis directional positions of the cutting unit 60 and the camera 62 relative to the chuck table 20 or the like are measured by the aforementioned Z-axis measurement unit.

The cutting unit 60 includes a spindle 64 (see FIG. 3A) which constitutes a rotary shaft substantially parallel to the Y-axis direction. In other words, an axis of the spindle 64 is substantially perpendicular to the X-axis direction and substantially parallel to the Y-axis direction. An annular cutting blade 66 is mounted to one end side of the spindle 64. A rotational drive source (not depicted) such as a motor is connected to the other end side of the spindle 64, and the cutting blade 66 is rotated by a torque of the rotational drive source that is transmitted through the spindle 64.

In addition, in the vicinity of the cutting blade 66, a cutting liquid supply nozzle 68 is provided which supplies a cutting liquid such as pure water to the workpiece 11, the cutting blade 66 and the like. On the lower side of the cutting blade 66 is disposed a blade position detection unit 70 which detects the position (height) of a lower end (tip) of the cutting blade 66 in the Z-axis direction.

The components of the cutting apparatus 2, such as the X-axis moving mechanism 6, the e table 16, the first valve 30, the second valve 36, the carrying mechanism, the cutting unit moving mechanisms 42, the cutting unit 60, the camera 62, and the blade position detection unit 70 are individually connected to a control unit 72.

The control unit 72 controls the aforementioned components of the cutting apparatus 2 in accordance with processing conditions for the workpiece 11 and the like. The control unit 72 includes a processing feeding control section 72a for controlling the aforementioned processing feeding, and an indexing feeding control section 72b for controlling the indexing feeding. The details of the processing feeding control section 72a and the indexing feeding control section 72b will be described later.

A chuck table correction method conducted by the aforementioned cutting apparatus 2 will be described below. In the chuck table correction method according to the present embodiment, first, a rotation step of rotating the cutting blade 66 and a positioning step of positioning the lower end of the cutting blade 66 at a cutting-in position for cutting into the holding surface 20c of the chuck table 20 are conducted.

Specifically, the cutting blade 66 is rotated at a speed (rotating speed) suitable for cutting of the chuck table 20. In addition, the cutting blade 66 is positioned in a region on the outer side than the chuck table 20 in the X-axis direction and the Y-axis direction, and the lower end of the cutting blade 66 is positioned below the holding surface 20c in the Z-axis direction.

Thereafter, a holding surface correction step is performed in which the chuck table 20 and the cutting unit 60 are relatively moved to cut the holding surface 20c side of the chuck table 20 by the cutting blade 66. The holding surface correction step includes a processing feeding step of relatively moving the chuck table 20 and the cutting unit 60 in the X-axis direction and an indexing feeding step of relatively moving the chuck table 20 and the cutting unit 60 in the Y-axis direction, in a state in which the lower end of the cutting blade 66 is positioned below the holding surface 20c, for example.

Figure 2B:
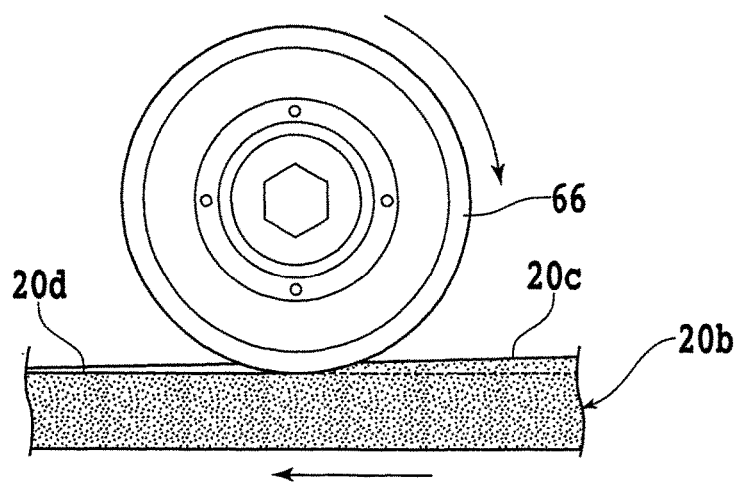
FIG. 2B is a schematic diagram depicting a part of FIG. 2A in an enlarged form.

FIG. 2A is a schematic diagram depicting the processing feeding step, and FIG. 2B is a schematic diagram depicting a part of FIG. 2A in an enlarged form. As illustrated in FIGS. 2A and 2B, the processing feeding control section 72a of the control unit 72 causes the chuck table 20 and the cutting unit 60 to be relatively moved in the X-axis direction, and causes the cutting blade 66 to cut into the chuck table 20. Specifically, the chuck table 20 is moved in the X-axis direction by the X-axis moving mechanism 6. By this, the holding surface 20c side of the chuck table 20 is cut by the cutting blade 66, to form a corrected surface 20d which is elongate in the X-axis direction.

Note that a width (a length in the Y-axis direction) of the corrected surface 20d depends on a thickness (a length in the Y-axis direction) of the cutting blade 66. Therefore, by using a thick cutting blade 66 having a thickness of not less than 1 mm, preferably, not less than 5 mm, for example, a corrected surface 20d having a large width can be formed and the chuck table 20 can be corrected efficiently. For example, when the chuck table 20 is moved to a region in which the chuck table 20 does not overlap with the cutting blade 66 as viewed in the Z-axis direction, the processing feeding step is finished.

Figure 3A:
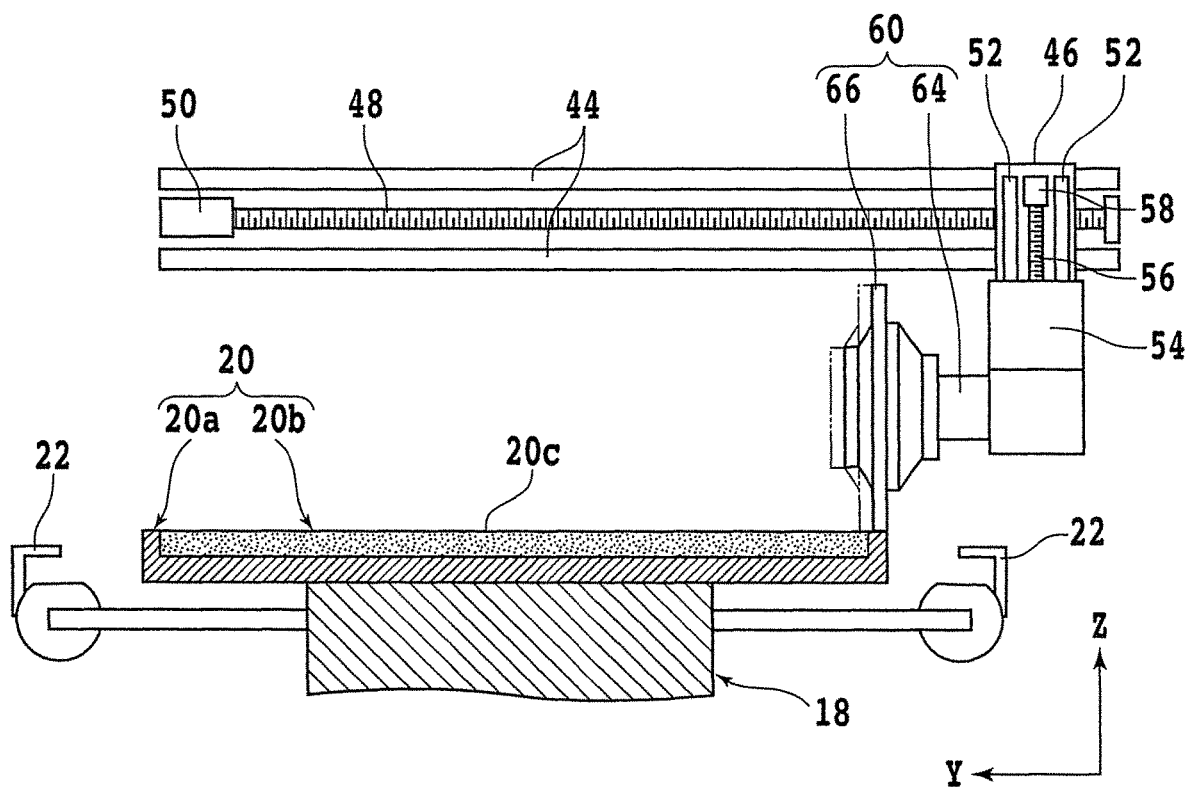
FIG. 3A is a schematic diagram depicting an indexing feeding step.
Figure 3B:
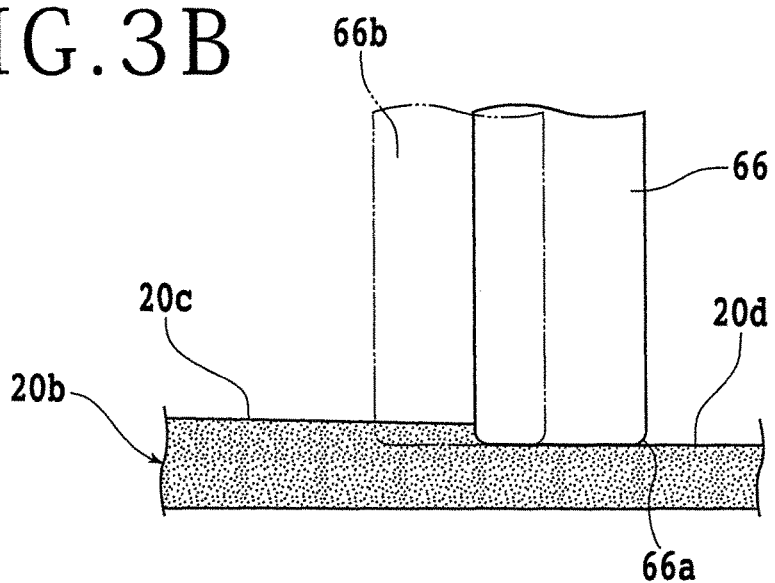
FIG. 3B is a schematic diagram depicting a part of FIG. 3A in an enlarged form.

After the processing feeding step, the indexing feeding step is conducted. FIG. 3A is a schematic diagram depicting the indexing feeding step, and FIG. 3B is a schematic diagram depicting a part of FIG. 3A in an enlarged form. As depicted in FIGS. 3A and 3B, in the indexing feeding step, the indexing feeding control section 72b of the control unit 72 causes the chuck table 20 and the cutting unit 60 to be relatively moved in the Y-axis direction.

More specifically, the cutting unit 60 is moved in the Y-axis direction by the cutting unit moving mechanism 42. The distance of movement is less than the thickness of the cutting blade 66. Note that the distance by which the cutting unit 60 is moved is desirably set to be as large as possible within such a range that no step is generated between a plurality of the corrected surfaces 20d formed by the cutting blade 66. For example, it is recommendable that the thickness of the cutting blade 66 exclusive of a curved surface region 66a present at an end of the cutting blade 66 is set as the distance of movement.

After the indexing feeding step, the processing feeding step is again performed. As aforementioned, in the indexing feeding step, the chuck table 20 and the cutting unit 60 have been relatively moved in the Y-axis direction by the distance smaller than the thickness of the cutting blade 66. Therefore, as depicted in FIG. 3B, a part of a lower end of a trajectory 66b of the cutting blade 66 in the processing feeding step overlaps with the corrected surface 20d formed in the immediately previous processing feeding step.

The processing feeding step and the indexing feeding step are repeated until the corrected surface 20d is formed wholly on the holding surface 20c side. When the corrected surface 20d is formed wholly on the holding surface 20c side, the holding surface correction step is finished.

On the corrected surface 20d formed in the aforementioned holding surface correction step, under the condition that the diameter of the cutting blade 66 does not change due to wear or the like, there are reflected influences of slight inclinations of the chuck table 20 which are generated due to the accuracy of mounting of the chuck table 20 to the chuck table base 18, movements (for example, pitching or yawing) of the X-axis moving mechanism 6 and the like.

Therefore, by forming the corrected surface 20d wholly on the chuck table 20 and using the corrected surface 20d as a new holding surface, the aforementioned influences of slight inclinations arising from the mounting accuracy of the chuck table 20, the movements of the X-axis moving mechanism 6 and the like can be cancelled, and the accuracy of cutting-in of the cutting blade 66 into the workpiece 11 can be enhanced sufficiently.

As has been described above, in the chuck table correction method according to the present embodiment, the lower end of the cutting blade 66 is positioned relative to the chuck table 20 at a predetermined height for cutting into the holding surface 20c of the chuck table 20, and the chuck table 20 and the cutting unit 60 are relatively moved in the processing feeding direction, whereby the holding surface 20c side of the chuck table 20 is cut by the cutting blade 66.

For this reason, the corrected surface 20d along the direction of relative movement of the chuck table 20 and the cutting unit 60 is formed on the holding surface 20c side of the chuck table 20. Therefore, by using the corrected surface 20d as a new holding surface, the accuracy of cutting-in of the cutting blade 66 relative to the workpiece 11 can be enhanced sufficiently.

For example, where a thin functional layer of approximately 1 µm to 5 µm is provided on the front surface side of the workpiece 11 and it is desired to remove the functional layer along division lines, it is recommendable to correct the chuck table 20 by use of the aforementioned chuck table correction method to form the corrected surface 20d that functions as a new holding surface. Note that in this case, an arbitrary cutting blade suited to removal of the functional layer is mounted to the cutting unit 60 after the corrected surface 20d is formed.

After the cutting blade suitable for removal of the functional layer is mounted to the cutting unit 60, the workpiece 11 is placed on the corrected surface 20d in such a manner that the direction of the division line to be processed is substantially parallel to the X-axis direction. Specifically, the dicing tape 13 adhered to the back surface side of the workpiece 11 is put into contact with the corrected surface 20d. In addition, the frame 15 is fixed by the clamps 22. By this, the workpiece 11 is held by the corrected surface 20d of the chuck table 20.

After the workpiece 11 is held by the holding surface 20d of the chuck table 20, the cutting blade is positioned on the upper side of an extension line of the division line. Besides, the cutting blade is rotated at a speed (rotating speed) suitable for removal of the functional layer. Then, the lower end of the cutting blade is positioned slightly below a lower end of the functional layer in the Z-axis direction.

Thereafter, the chuck table 20 and the cutting unit 60 are relatively moved in the X-axis direction, and the cutting blade is made to cut into the workpiece 11. More specifically, the chuck table 20 is moved in the X-axis direction by the X-axis moving mechanism 6. By this, mainly the functional layer is cut away along the division line of the workpiece 11.

In the present embodiment, as aforementioned, the corrected surface 20d is formed on which the influences of slight inclinations arising from the mounting accuracy of the chuck table 20, the movements of the X-axis moving mechanism 6 and the like are reflected. Therefore, the influences on the chuck table 20 of slight inclinations arising from the mounting accuracy of the chuck table 20, the movements of the X-axis moving mechanism 6 and the like can be cancelled, and the accuracy of cutting-in of the cutting blade 66 into the workpiece 11 can be enhanced sufficiently. As a result, even a thin functional layer or the like can also be removed suitably.

Note that the present invention is not limited to the description of the above embodiment and the like, but can be carried out with various modifications. For example, where a cutting blade 66 formed by use of a hard binding agent such as, for example, a vitrified one is used, the cutting blade 66 is not easily abraded, so that a corrected surface 20d parallel to the X-axis direction and the Y-axis direction is formed easily. It is to be noted, however, that the kind of the cutting blade 66 to be used is not particularly limited.

Other than the above, the structure, method and the like according to the present embodiment can be carried out with appropriate modifications insofar as they do not depart from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chuck table correction method for correcting a chuck table provided in a cutting apparatus,
   the cutting apparatus including:
   the chuck table adapted to hold a workpiece by a holding surface;
   a cutting unit adapted to cut the workpiece held by the chuck table by an annular cutting blade mounted to a spindle;
   a processing feeding unit adapted to relatively move the chuck table and the cutting unit in a processing feeding direction perpendicular to an axis of the spindle;
   an indexing feeding unit adapted to relatively move the chuck table and the cutting unit in an indexing feeding direction parallel to the axis of the spindle; and
   a cutting-in feeding unit adapted to relatively move the chuck table and the cutting unit in a cutting-in feeding direction perpendicular to the processing feeding direction and the indexing feeding direction,
   wherein an outer radial edge of the annular cutting blade is positioned, relative to the chuck table, at a predetermined height for cutting into the holding surface, and the chuck table and the cutting unit are relatively moved in the processing feeding direction, to cut the holding surface side of the chuck table by the cutting blade, thereby forming the chuck table with a corrected surface that functions as a new one of the holding surface,
   wherein the corrected surface is substantially parallel to the axis of the spindle of the annular cutting blade,
   wherein the holding surface of the chuck table includes a holding plate surrounded by a portion of a frame body, and
   wherein the corrected surface includes both an upper surface of the holding plate and an upper surface of the portion of the frame body that surrounds the holding plate.

2. The chuck table correction method according to claim 1, comprising:
   a processing feeding step of relatively moving the chuck table and the cutting unit in the processing feeding direction in a state in which the outer radial edge of the annular cutting blade is positioned at the predetermined height; and
   an indexing feeding step of relatively moving the chuck table and the cutting unit in the indexing feeding direction by a distance smaller than a thickness of the annular cutting blade,
   wherein the processing feeding step and the indexing feeding step are repeated to thereby form the corrected surface wholly on the holding surface side.

3. The chuck table correction method according to claim 1, wherein:
   the holding plate is formed of a porous ceramic material, and
   the frame body is formed of a conductive non-metallic material.

4. A cutting apparatus comprising:
   a chuck table adapted to hold a workpiece by a holding surface;
   a cutting unit adapted to cut the workpiece held by the chuck table by an annular cutting blade mounted to a spindle;
   a processing feeding unit adapted to relatively move the chuck table and the cutting unit in a processing feeding direction perpendicular to an axis of the spindle;
   an indexing feeding unit adapted to relatively move the chuck table and the cutting unit in an indexing feeding direction parallel to the axis;
   a cutting-in feeding unit adapted to relatively move the chuck table and the cutting unit in a cutting-in feeding direction perpendicular to the processing feeding direction and the indexing feeding direction; and
   a control unit adapted to control each component of the cutting apparatus,
   wherein the chuck table includes a suction region having a suction hole for sucking the workpiece, and a peripheral region formed from a conductive non-metallic material and surrounding the suction region, and
   the control unit causes an outer radial edge of the annular cutting blade to be positioned, relative to the chuck table, at a predetermined height for cutting into the holding surface, and causes the chuck table and the cutting unit to be relatively moved in the processing feeding direction, to cause the annular cutting blade to cut into the holding surface side of the chuck table, thereby forming the chuck table with a corrected surface that functions as a new one of the holding surface,
   wherein the corrected surface is substantially parallel to the axis of the spindle of the annular cutting blade,
   wherein the holding surface of the chuck table includes a holding plate surrounded by a portion of a frame body, and
   wherein the corrected surface includes both an upper surface of the holding plate and an upper surface of the portion of the frame body that surrounds the holding plate.

5. The cutting apparatus according to claim 4, wherein the control unit includes:
   a processing feeding control section adapted to cause the chuck table and the cutting unit to be relatively moved in the processing feeding direction in a state in which the outer radial edge of the annular cutting blade is positioned at the predetermined height; and
   an indexing feeding control section adapted to cause the chuck table and the cutting unit to be relatively moved in the indexing feeding direction by a distance smaller than a thickness of the annular cutting blade, and the relative movement in the processing feeding direction caused by the processing feeding control section and the relative movement in the indexing feeding direction caused by the indexing feeding control section are repeated, to form the correction surface wholly on the holding surface side.

6. The cutting apparatus according to claim 4, wherein:

the holding plate is formed of a porous ceramic material, and the frame body is formed of a conductive non-metallic material.

* * * * *